United States Patent
Riehl et al.

(10) Patent No.: US 6,445,584 B1
(45) Date of Patent: Sep. 3, 2002

(54) ELECTRONIC CONTROL UNIT

(75) Inventors: Guenther Riehl; Bernhard Severin, both of Buehlertal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/869,811

(22) PCT Filed: Nov. 1, 2000

(86) PCT No.: PCT/DE00/03833

§ 371 (c)(1),
(2), (4) Date: Jul. 5, 2001

(87) PCT Pub. No.: WO01/33926

PCT Pub. Date: May 10, 2001

(30) Foreign Application Priority Data

Nov. 5, 1999 (DE) .......................................... 199 53 191

(51) Int. Cl.⁷ ................................................. H05K 7/20
(52) U.S. Cl. ........................ 361/707; 361/709; 361/715; 361/730; 361/752; 361/772
(58) Field of Search ................................. 361/600, 622, 361/679, 688, 690, 707, 709, 710, 711, 715, 717–720, 722, 730, 752, 753, 772; 363/141, 144

(56) References Cited

U.S. PATENT DOCUMENTS

| | | | | |
|---|---|---|---|---|
| 4,873,615 A | * | 10/1989 | Grabbe | 361/707 |
| 4,899,256 A | * | 2/1990 | Sway-tin | 361/707 |
| 5,031,069 A | * | 7/1991 | Anderson | 361/707 |
| 5,398,160 A | * | 3/1995 | Umeda | 361/707 |
| 5,657,203 A | * | 8/1997 | Hirao et al. | 361/707 |

FOREIGN PATENT DOCUMENTS

| | | |
|---|---|---|
| DE | 89 09 674 | 11/1989 |
| DE | 198 32 560 | 1/1999 |
| DE | 198 51 455 | 8/1999 |
| EP | 0 359 606 | 3/1990 |

* cited by examiner

*Primary Examiner*—Gregory Thompson
(74) *Attorney, Agent, or Firm*—Kenyon & Kenyon

(57) ABSTRACT

To achieve an effective dissipation of the heat generated by the power components including a design that is as compact as possible as well as simple assembly in the case of an electronic control unit having a printed circuit board situated in a closed housing and provided with electrical and/or electronic components, and having, arranged at the housing, at least one connector part whose contact elements, which are partially embedded in the housing, are electrically connected to the printed circuit board, it is proposed that the housing includes a housing frame produced as an injection-molded part and having an open topside and bottom side, metallic conductor strips formed by at least one punched grid being partially embedded in the housing frame. Furthermore, it is also proposed that the bottom side of the housing frame is closed by a metallic base part provided as a heat sink, and the topside is closed by a cover part; and that provided between the base part and the printed circuit board are power components, whose leads are in contact with the printed circuit board and/or the conductor strips, and whose underside, which is formed by a cooling plate, and which faces away from the printed circuit board, is connected in a heat conducting manner to the base part.

8 Claims, 3 Drawing Sheets

ELECTRONIC CONTROL UNIT

FIELD OF THE INVENTION

The present invention relates to an electronic control unit.

BACKGROUND INFORMATION

A control unit is described in German Published Patent Application No. 198 51 455 and is used, for example, for controlling an electromotively operated drive unit. The known control unit includes a box-shaped, plastic base part provided with two connector parts, the printed circuit board being inserted into the base part, which can be closed with a cover. The box-shaped base part is produced together with the connector parts as injection-molded parts.

In the case of the known control unit, it is disadvantageous that it is problematic to introduce power components into the housing since there is no heat sink, and the heat from the closed plastic housing cannot be released to the surroundings. In addition, introducing a heat sink into the housing is quite complicated and would result in a disadvantageous enlargement of the housing. Both an optimum dissipation of heat and a simple, mechanical design are not possible in the case of the known control unit.

SUMMARY OF THE INVENTION

Using the control unit according to the present invention. The disadvantages known in the related art are prevented. The control unit is inexpensive to manufacture using a minimum of components and has an exceedingly compact design. Particularly advantageous is the very flat, space-saving construction having a minimal overall height in combination with the realization of an efficient dissipation of the heat generated by the power components. This is advantageously achieved in that the housing is formed by a housing frame that is open on both sides, and whose open bottom side is covered by a metallic heat sink that forms the base part of the housing, the power components situated in the housing being in contact, on their sides that face away from the printed circuit board and that are provided as a cooling surface, with the heat sink. Contact elements of the connector parts and peak current-carrying conductor strips are formed in a simple manner by a punched grid, which can be embedded in the housing frame by injection molding. The leads of the power components can advantageously be contacted by the printed circuit trace of the printed circuit board and/or by sections of the punched grid not embedded in plastic.

It is advantageous that the housing frame is provided with crossbars on which a holding arrangement for the power components and/or a holding arrangement for further electrical components are formed. As a result, not all components must be positioned on the printed circuit board, and large components, which use a lot of space, can be fastened to the holding arrangement of the housing frame, independently of the printed circuit board. Due to this measure, the overall height of the arrangement is significantly reduced. Moreover, as a result of the crossbars, a particularly stable construction as well as a simpler assembly are achieved. Thus, large capacitors, for example, can be preassembled on the housing frame, and the printed circuit board can be subsequently fixed to the housing frame.

Advantageously, the contact elements of the at least one connector part are formed by the metallic conductor strips of the punched grid.

Furthermore, it is advantageous to arrange the printed circuit board between the conductor strips and the cover part. As a result, the leads of the power components, which are situated on the side of the printed circuit board facing the metallic base part, are electrically connected to the printed circuit board and/or to the conductor strips of the punched grid. Therefore, it is possible, for example, for high current-carrying leads of power transistors to directly contact the conductor strips and for signal-current-carrying lead to be directly connected to the printed circuit board.

As a result of the contact segments of the conductor strips bent in the direction of the topside of the housing frame passing through contact openings of the printed circuit board and being electrically connected to the printed circuit board, the electrical connection between the punched grid and the printed circuit board can be produced in a simple manner, e.g. by dip-soldering.

Advantageously, the topside and/or the bottom side of the housing frame is/are provided with a circumferential seal on which the cover part and the base part are placed. A particularly effective protection against moisture and environmental influences can be achieved by the housing formed from the housing frame, metallic base part, and cover part being a hermetically sealed housing.

The compact, flat construction can be further improved by the metallic base part being provided with at least one retraction space and/or at least one platform for supporting the power components and/or the additional electrical components.

DETAILED DESCRIPTION

Figure 1:
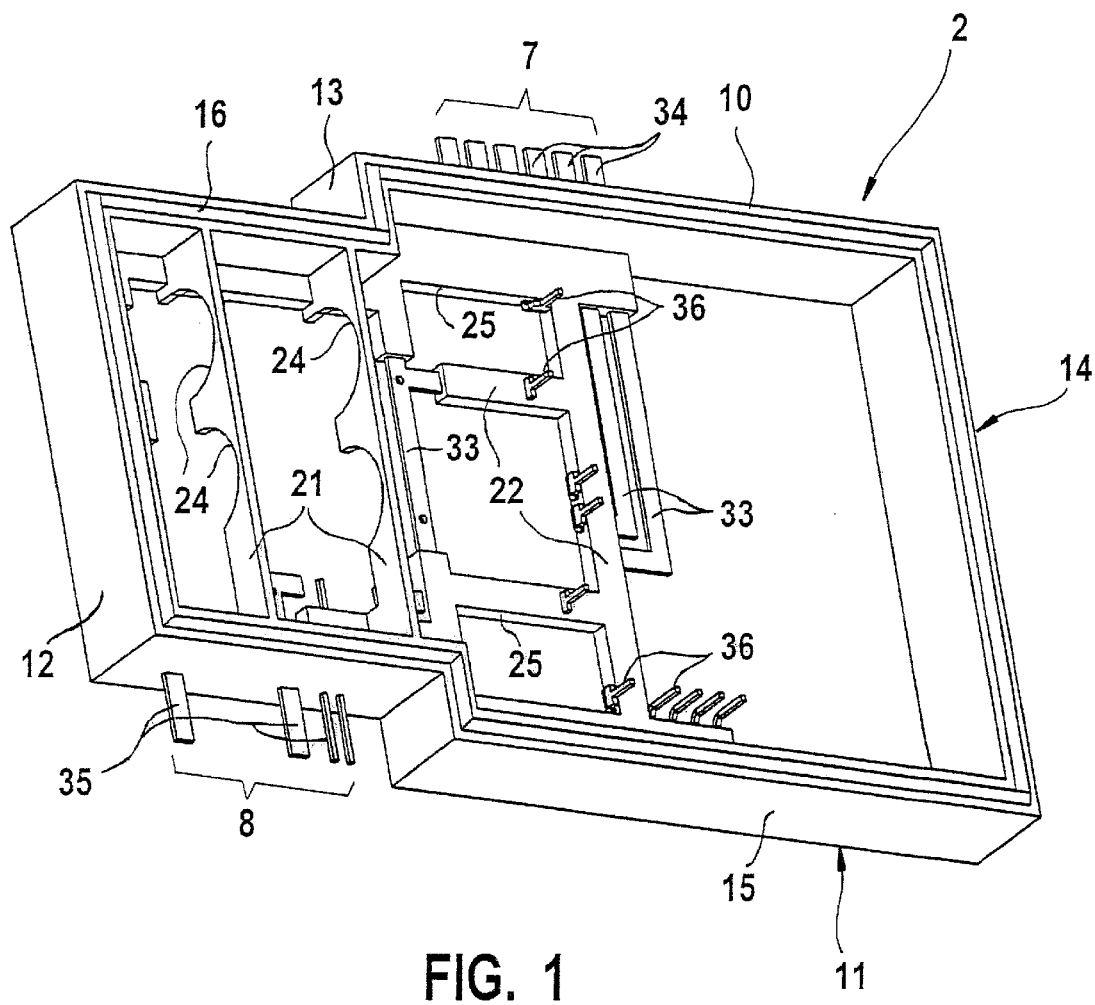
FIG. 1 shows a perspective view of the housing frame including the conductor strips that are partially embedded in the housing frame, and that are formed by a punched grid.
Figure 2:
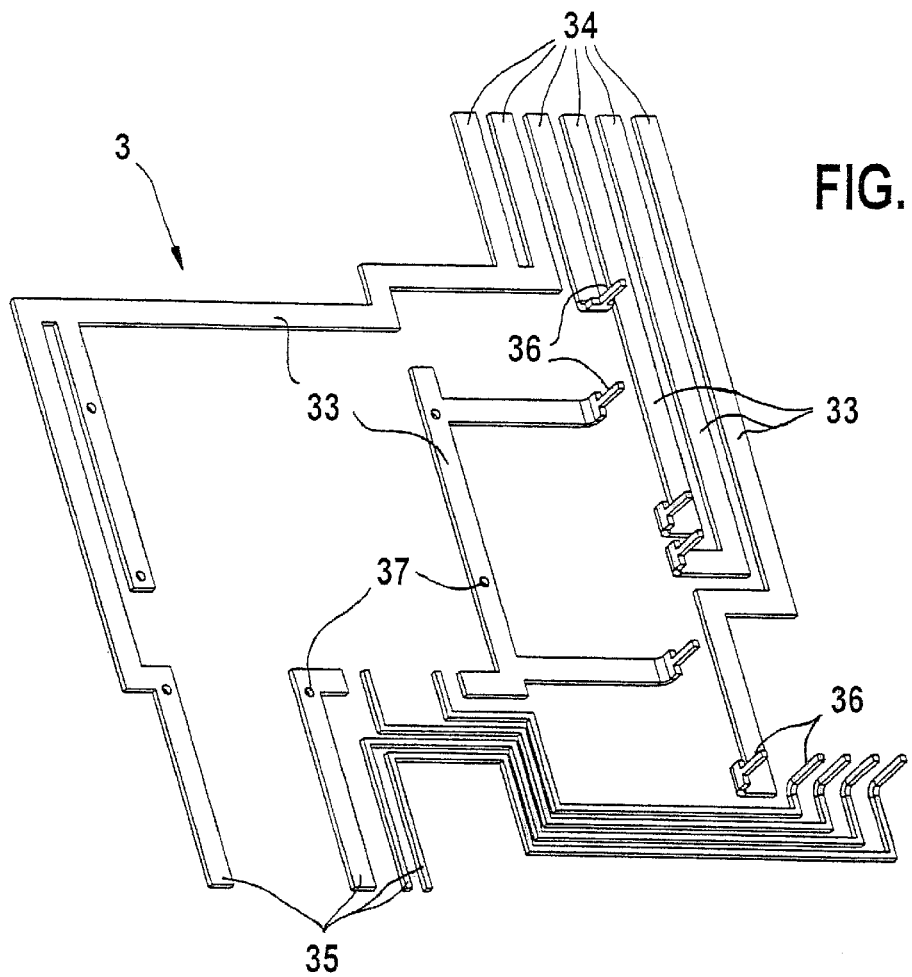
FIG. 2 shows the punched grid including the conductor strips.

Housing 1 of the control unit according to the present invention includes a housing frame 2 formed from four sidewalls 12, 13, 14 and having an open bottom side 11 and an open topside 10, as shown in FIG. 1. On its topside 10 and bottom side 11, the frame has a circumferential seal 16. Housing frame 2 is produced as a plastic injection-molded part having metallic conductor strips 33 partially embedded therein. Conductor strips 33 are formed from a punched grid 3, as can best be seen in FIG. 2. Contact elements 34 for a first connector part 7 and contact elements 35 for a second connector part 8 as well as high current-carrying printed circuit board traces are formed by the conductor strips of punched grid 3. Several conductor strips 33 are provided with openings 37 for connecting pins of electrical components. The ends of conductor strips 33 are partially bent at right angles, the bent ends forming contact segments 36 for connecting conductor strips 33 to a printed circuit board 6, as is further explained below. Punched grid 3 is produced in the conventional manner by punching and subsequently separating from the connecting segments, which connect conductor strips 33 to one another. The connecting segments can be separated prior to the conductor strips being injected into housing frame 3 or after the injection, via suitably formed cut-outs in housing frame 2. As can be seen in FIG.

1, segments 34 of the conductor strips form a first connector part 7, and segments 35 form a second connector part 8. As can further be seen in FIG. 1, housing frame 2 has crossbars 21, 22, which are fixed to the inside of sidewalls 12, 15. Conductor strips 33 can be partially situated in crossbars 22. Holding arrangements 24 are formed on crossbars 21 for large capacitor components 60. Crossbars 23 have holding arrangements 25 for power transistors 50, in the form of rectangular cut-outs.

Figure 3:
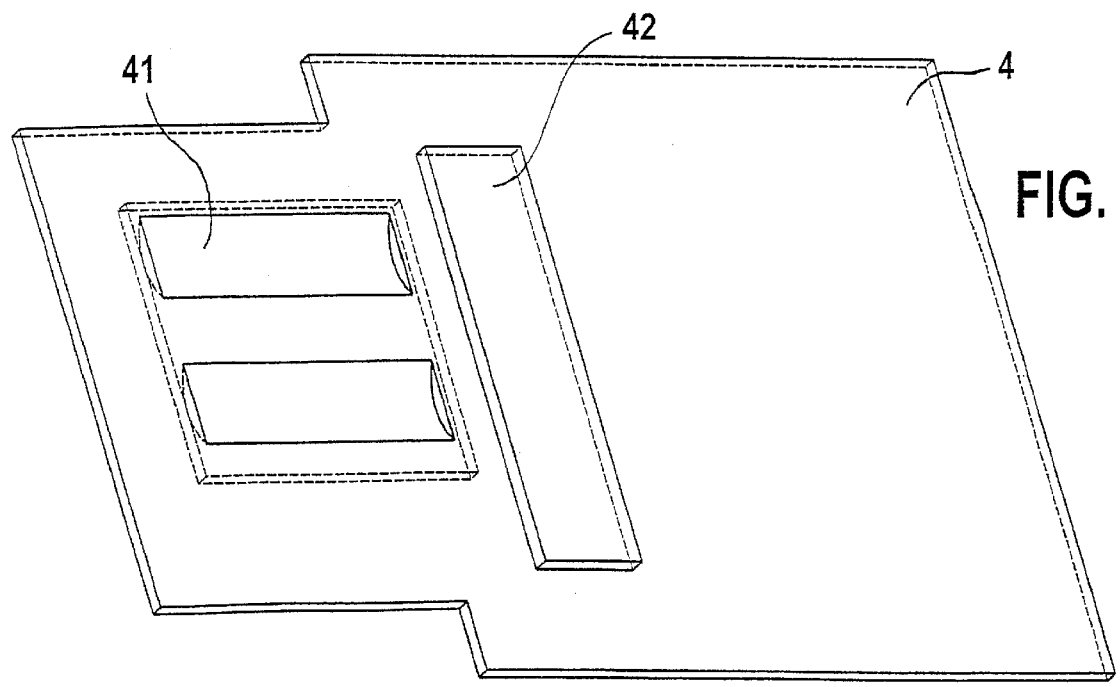
FIG. 3 shows the metallic base part.
Figure 4:
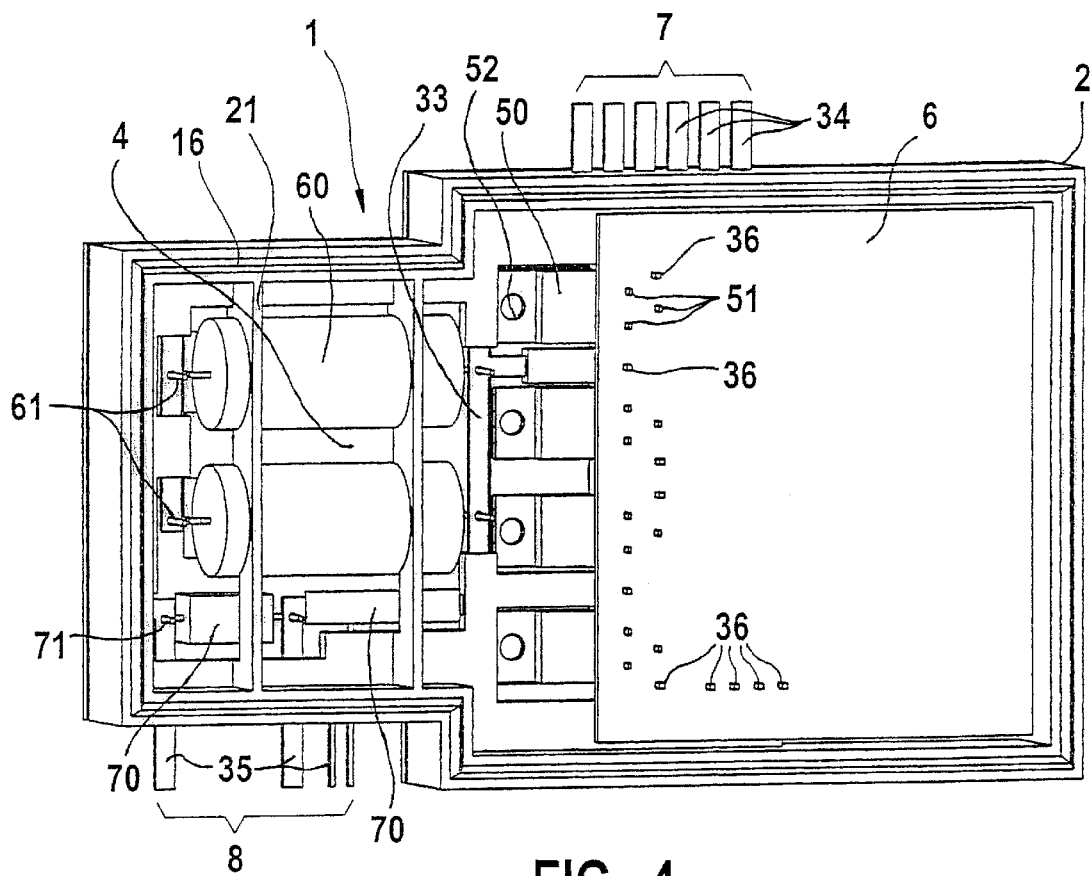
FIG. 4 shows a perspective view of the assembled control unit with the cover removed.

FIG. 4 shows the assembled control unit with the cover removed. Capacitor components 60 and additional electrical components 70 can be placed from open bottom side 11 of housing frame 2 into holding arrangements 24 of crossbars 21. Leads 61 of capacitor components 60 and leads 71 of additional components 70 are inserted into openings 37 of conductor strips 33 and soldered to the conductor strips, for example. Subsequently, a metallic base plate 4, which is represented in FIG. 3, is placed on bottom side 11 of the housing frame and adhered, screwed, connected via a fastening arrangement or another suitable manner thereto. Metallic base part 4 has retraction spaces 41, whose contour is adapted to capacitor components 60. When placing base part 4, capacitor components 60 are partially situated in retraction spaces 41, so that a particularly flat type of construction is possible.

Figure 5:
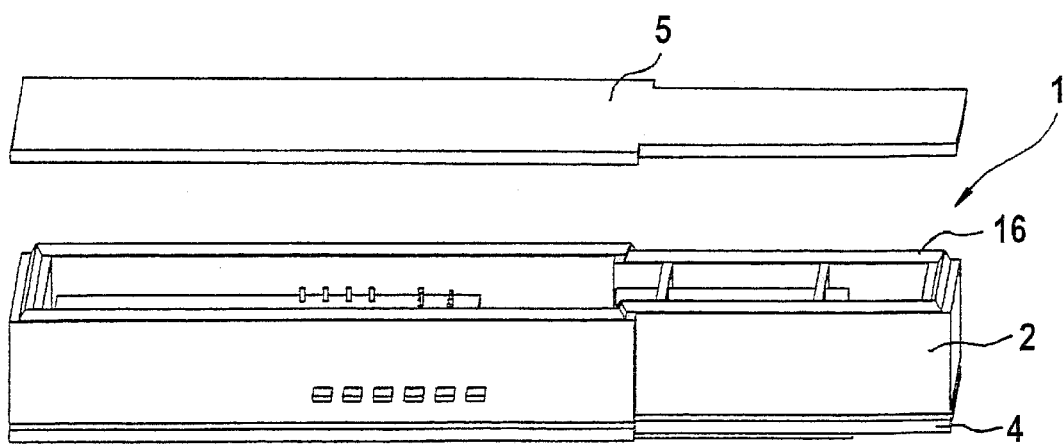
FIG. 5 shows a side view of the control unit from FIG. 4, including the cover.

As can be further seen in FIG. 4, a printed circuit board 6 provided with electronic circuit elements is inserted into housing frame 2. Each power transistor 50 is electrically connected to printed circuit board 6 via its three leads 51, which pass through contact openings in the printed circuit board. This can be carried out prior to printed circuit board 6 being inserted into the housing frame. It is also possible to at least partially directly connect leads 51 of power transistors 50 to conductor strips 33 of punched grid 3 provided for conducting high currents. On their bottom side, power transistors 50 have a cooling plate 52, e.g. a copper plate. Leads 51 of power transistors 50 are bent at right angles in the direction of the topside of the power transistors facing away from cooling plate 52 and are inserted in this direction into the contact openings of the printed circuit board. Advantageously, leads 51 extend parallelly to contact segments 36 of the conductor strips, so that they can be soldered, e.g. by dip-soldering, to the printed circuit board, together, in one process step. Bottom side 52 of power transistors 50, which faces away from the printed circuit board, comes to rest directly on a platform 42 of metallic base part 4. It is also possible to position power transistors 50 on metallic base part 4 via a heat-conducting adhesive or the like. Crossbars 22 of the housing frame are also advantageously used for fixing printed circuit board 6. As can be seen in FIG. 4, an extremely compact and flat type of construction is achieved by the represented design, despite existing heat sink 4, power transistors 50 diverting the generated heat directly to base part 4. After printed circuit board 6 is inserted, cover part 5 is placed on circumferential seal 16 on topside 10 of the control unit, as shown in FIG. 5.

What is claimed is:

1. An electronic control unit, comprising:
    a closed housing including a housing frame that includes an open topside and an open bottom side, the housing frame being produced as an injection-molded part;
    at least one punched grid partially embedded in the housing frame;
    metallic conductor strips formed by the at least one punched grid;
    a printed circuit board situated in the closed housing and provided with at least one of electrical components and electronic components;
    at least one connector part located at the closed housing, the at least one connector part including contact elements that are partially embedded in the closed housing and that are electrically connected to the printed circuit board;
    a metallic base part provided as a heat sink and by which the bottom side of the housing frame is closed;
    a cover part by which the topside is closed;
    power components provided between the base part and the printed circuit board, the power components including leads that are in contact with at least one of the printed circuit board and the metallic conductor strips; and
    a cooling plate forming an underside of the power components and facing away from the printed circuit board, the cooling plate being connected in a heat conducting manner to the metallic base part.

2. The electronic control unit according to claim 1, wherein:
    the housing frame includes crossbars on which at least one of a holding arrangement for the power components and a holding arrangement for additional electrical components are formed.

3. The electronic control unit according to claim 1, wherein:
    the contact elements are formed by the metallic conductor strips.

4. The electronic control unit according to claim 1, wherein:
    the printed circuit board is situated between the metallic conductor strips and the cover part.

5. The electronic control unit according to claim 4, wherein:
    the metallic conductor strips include contact segments that are bent in a direction perpendicular to the metallic conductor strips in a direction of the topside of the housing frame and that pass through contact openings in the printed circuit board, the contact segments being electrically connected to the printed circuit board.

6. The electronic control unit according to claim 1, wherein:
    at least one of the topside and the bottom side of the housing frame is provided with a circumferential seal.

7. The electronic control unit according to claim 1, wherein:
    the metallic base part is provided with at least one of at least one retraction space and at least one platform for supporting at least one of the power components and additional electrical components.

8. The electronic control unit according to claim 1, wherein:
    the closed housing formed from the housing frame, the metallic base part, and the cover part is a hermetically sealed housing.

* * * * *